United States Patent [19]
Schorman

[11] Patent Number: 5,309,443
[45] Date of Patent: May 3, 1994

[54] DYNAMIC MUTING METHOD FOR ADPCM CODED SPEECH

[75] Inventor: Eric Schorman, Bedford, Tex.

[73] Assignee: Motorola, Inc., Schaumburg, Ill.

[21] Appl. No.: 894,303

[22] Filed: Jun. 4, 1992

[51] Int. Cl.$^5$ .................................................. H04B 1/10
[52] U.S. Cl. .......................................... 371/5.5; 381/94; 455/67.3
[58] Field of Search ...................... 371/5.1, 5.5; 381/94

[56] References Cited
U.S. PATENT DOCUMENTS

| | | | |
|---|---|---|---|
| 4,593,392 | 6/1986 | Kouyama | 371/31 |
| 4,811,404 | 3/1989 | Vilmur et al. | 381/94 |
| 4,943,964 | 7/1990 | Hatanaka et al. | 371/31 |
| 5,148,431 | 9/1992 | Hayashi | 371/5.1 |
| 5,163,053 | 11/1992 | Okumura et al. | 371/31 |
| 5,187,811 | 2/1993 | Baker et al. | 455/35.1 |
| 5,235,334 | 8/1993 | Manvar et al. | 341/143 |

*Primary Examiner*—Stephen M. Baker
*Attorney, Agent, or Firm*—Jon P. Christensen

[57] ABSTRACT

A method and apparatus are provided for muting a audio signal in a digital communication system. The method includes the steps of integrating an indicated error per frame for a time interval and comparing the integrated value with a threshold. The method also includes the step of applying a heavy mute to a frame, with an indicated error, when the integrated value does not exceed the threshold and a light mute to a frame with an indicated error, when the integrated value exceeds the threshold. Integrating the indicated error allows a heavy mute to be applied to bad frames when errors are occasional in nature. Integration also allows a light mute to be applied in the case where the content of a signal has been highly corrupted with erroneous information thereby maximizing the information content of good frames while still allowing contributions from corrupted frames at a reduced signal level.

20 Claims, 1 Drawing Sheet

DYNAMIC MUTING METHOD FOR ADPCM CODED SPEECH

FIELD OF THE INVENTION

The field of the invention relates to communication systems and in specific to muting of voice signals within communication systems.

BACKGROUND OF THE INVENTION

Muting systems for radio frequency (RF) receivers are known. Such systems are used to suppress noise at an output of a radio receiver. Muting systems suppress noise at the output of the radio by disabling the audio output of a received signal in the absence of a desired signal. In some cases muting is activated by comparison of a received signal with a threshold value. If the received signal does not exceed the threshold then the signal is deemed absent and the radio muted. Where a competing signal stronger than the desired signal is present, on the other hand, the muting system fails.

Muting systems in radios, in the past, have been provided to improve the quality of audio signals perceived by an operator. Such muting systems accomplished such objective by completely suppressing the received signal or simply reducing the output level of the signal.

Digital error detection systems are also known. Error detection systems are pervasively used where digital signals are exchanged. Such detection systems typically include a parity bit or some other indication of the information content of a transmitted digital word.

In the context of digital radio communication systems, audio signals are typically converted into digital representations of the audio signal and transmitted within frames containing error correction/detection coding. A digital receiver within the system upon receipt of a frame of information compares the received information with the error coding as a measure of the accuracy of the received data word. If the error coding indicates that the data is erroneous the receiver simply discards the erroneous data.

The suppression of erroneous data in digital receivers has largely replaced the muting function of earlier radios. Since only erroneous data is discarded an intelligible signal may be recovered even under conditions of weak signal reception While error detection systems have considerably improved the performance of radio receivers over prior art analog systems, problems are still experienced under conditions of very weak signal reception or where a significant portion of the data is corrupted. Where significant errors exist within a received signal, large portions of the signal may be discarded. Without the missing data the received signal may have audio gaps producing a choppy audio effect that may, or may not, be intelligible.

Prior art muting systems were typically provided with an adjustable muting levels. With the adjustable muting level, a very weak signal including considerable interference may still be discernible by an operator. Digital systems that delete erroneous data do not have the capability of allowing partially corrupted data to be monitored by an operator. Because of the importance of communication systems a need exists for a method of including at least a portion of corrupted data in a recovered signal.

SUMMARY OF THE INVENTION

A method and apparatus are provided for muting an audio signal in a digital communication system. The method includes the steps of integrating an indicated error per frame for a time interval and comparing the integrated value with a threshold. The method also includes the step of applying a heavy mute to a frame with an indicated error when the integrated value does not exceed the threshold and a light mute to a frame with an indicated error when the integrated value exceeds the threshold.

DETAILED DESCRIPTION OF THE PREFERRED EMBODIMENT

Figure 1:
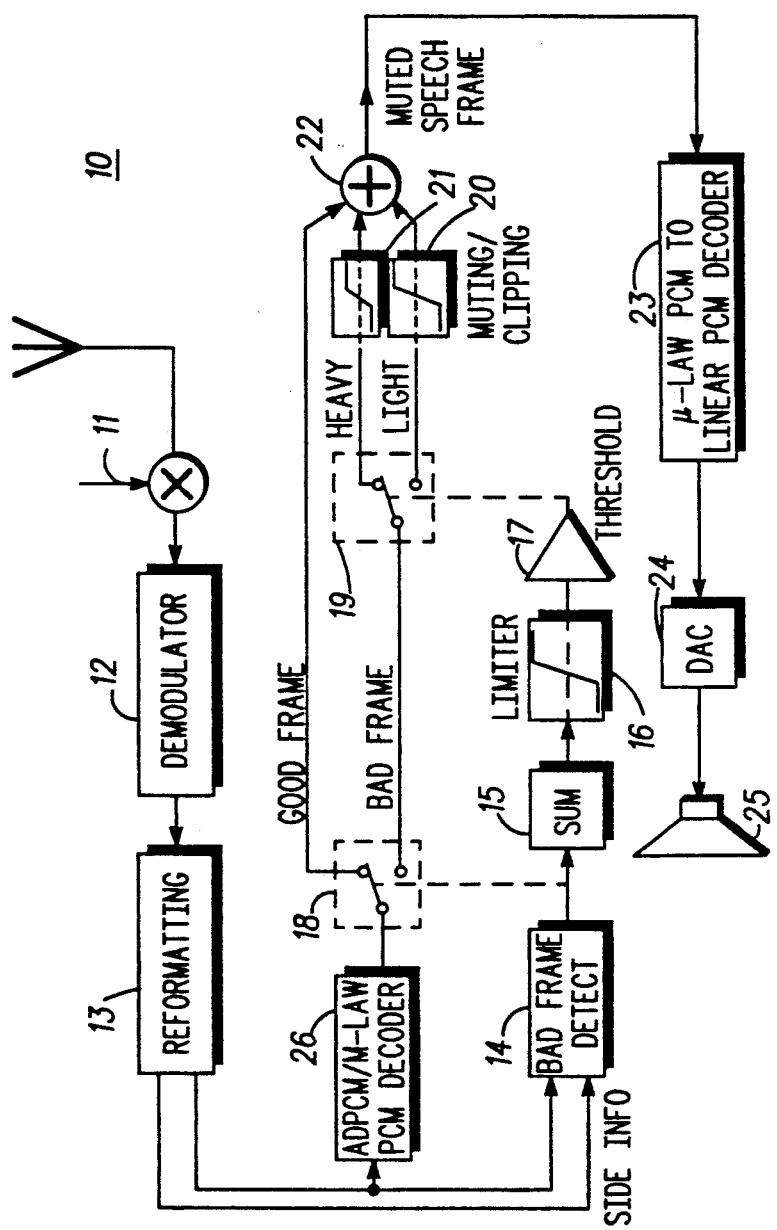
FIG. 1 comprises a block diagram of a method and apparatus for dynamically muting a received signal, in accordance with one embodiment of the invention, based on the error content of the received signal.

The solution to the problem of gaps in a recovered signal caused by discarded data lies, conceptually, in retaining the erroneous data and dynamically muting the erroneous data based upon an incidence average of the occurrence of errors. Muting, under such a system, would be heavy where such data constitutes a minor part of the recovered signal and light where the erroneous data constitutes a significant portion of the recovered signal.

The invention describes a system wherein occasional erroneous frames are heavily attenuated (muted) and wherein the incidence of a large number of erroneous frames results in a light muting of the erroneous frames. Good frames, in accordance with the preferred embodiment, are not muted.

The heavy muting of occasional erroneous frames does not appreciably affect audio quality and, in fact, improves such quality by attenuating objectionable noise. The light muting of erroneous frames, when large numbers of erroneous frames are present, improves the quality of a received signal by filling gaps in received audio with information that may still be perceptible to the listener even through containing partially corrupted data.

Shown in FIG. 1 is a block diagram of a digital radio frequency (RF) receiver, generally (10), in accordance with the invention. Included within the receiver (10) is a mixer (11), a demodulator (12), reformatter (13), bad frame detector (14), ADPCM/μ-Law decoder (26), switch (18), summer (15), limiter (16), threshold detector (17), switch (19), heavy attenuator (21), light attenuator (20), decoder (23), and speaker (24). The mixer (11) provides a means for reducing a received RF signal to a zero-intermediate frequency for processing of voice frames.

The received signal may be transmitted under any appropriate modulation method including amplitude modulated (AM), frequency modulated (FM), phase modulation, or any of the multilevel-modulation techniques (e.g. quaternary phase shift keying (QPSK), or 16, 64, or higher, quadrature amplitude modulated (QAM) signals). The demodulator (12), operating under a suitable demodulation technique, demodulates the zero-IF signal to produce a pulse code modulated (PCM) signal containing voice and control information within a series of voice frames.

Control information, contained with each voice frame in accordance with the preferred embodiment, includes a means for detecting bad frames such as a bad frame status indicator. The bad frame status indicator provides an indicated error message for identifying erroneous frames. The indicated error message may be in the form of a cyclic redundancy check (CRC).

The demodulated signal may be any pulse code modulated (PCM) signal such as the adaptive differential pulse code modulated (ADPCM) signal. ADPCM is chosen, under the preferred embodiment, because of the low encoding delay and high voice quality in the absence of errors. Forward error correcting coding is unnecessary, under the preferred embodiment, because of the presence of the CRC and the beneficial muting of erroneous frames.

The demodulated ADPCM signal after being demodulated (12) is reformatted (13) to recover the CRC codes embedded within each frame. The CRC codes are applied to a means for detecting bad frames (bad frame detector) (14) along with each raw speech frame. The bad frame detector (14) calculates a local CRC value from the raw speech frame and compares it with the received CRC, recovered from the demodulated signal. If the local CRC matches the received CRC then the frame is assumed to be good (free from errors).

When the received frame is received free of errors the frame is processed through the ADPCM/μ-Law decoder (26), and switch 18, to the adder (22) where is concatenated (22) with prior frames. The frame is then decoded into linear PCM within decoder 23 and converted into an analog signal within an digital to analog converter (24) and transmitted to an audio speaker (25).

If the local CRC does not match the received CRC, then the bad frame detector (14) outputs an indicated error, activating switch 18 and providing an input to a leaky integrator (summer 15). Upon activation of the switch 18 the bad frame passes through a second switch (19) through one of two attenuators (20 or 21) depending on the state of the threshold detector (17). From the attenuators (20 or 21) the attenuated erroneous signal is then concatenated (22) with prior frames, decoded (23) and transmitted to an audio speaker (25).

Within the summer (15) an updated, integrated value is calculated for each raw speech frame. The calculated value is based upon a first or second value. Where a bad frame is detected, the value within the summer (15) is incremented by the first value. Where a good frame is detected the value within the summer (15) decremented by the second value.

The output of the summer (15) in input to a limiter (16). Under the preferred embodiment the limiter limits the value within the summer (15) to a range of between zero and a value of 1.0. The output of the limiter is input to a threshold detector. The threshold value may be set to any value between zero and one. Under the preferred embodiment the threshold detector is set to a value of 0.6.

Under the preferred embodiment of the invention, the first value (used in the calculation of the updated integrated value) is selected to exceed the threshold upon the incidence of three consecutive bad frames. To this end a value of 0.2 is selected as the first value.

The second value is selected to ensure that the integrated value will be below the threshold after 40 frames. To this end a second value of 0.01 is selected.

Attenuation of bad frames may be accomplished at a number of points within the receiver. Within FIG. 1 examples of where the bad frames may be attenuated include where the raw speech frame is demodulated into an ADPCM format, transcoded into μ-Law PCM in decoder 26, decoded into linear PCM within the decoder (23) and into analog in the ADC converter (24). Muting, in accordance with the preferred embodiment is accomplished within attenuators (20 or 21) by ORing of chord bits of the μ-law PCM signal. Attenuation under conditions of heavy muting, in accordance with the preferred embodiment is substantially equal to a eighteen decibel reduction in the magnitude of the received signal. Attenuation under conditions of light muting, in accordance with the preferred embodiment is substantially equal to a six decibel reduction in the magnitude of the received signal.

Application of heavy muting in the case of occasional bad frames beneficially reduces bursts and other distracting noise from a received signal. The use of a leaky integrator (15) also allows for a dynamic tracking and dynamic muting of a received signal based upon the error content of the signal. Use of light muting during periods of high signal distortion allows for a information content of an audio signal that, even though high in erroneous signal content, may still be discernible to an operator.

I claim:

1. A method of muting an audio signal in a digital communication system, such method comprising the steps of: integrating an indicated error per frame for a time interval; comparing the integrated value with a threshold; and applying a heavy mute to a frame with an indicated error when the integrated value does not exceed the threshold and a light mute to a frame with an indicated error when the integrated value exceeds the threshold.

2. The method as in claim 1 wherein integrating an indicated error bit per frame for a time interval further includes the step of incrementing a counter by a first value upon receipt of a bad frame and decrementing a counter by a second value upon receipt of a good frame.

3. The method as in claim 1 further including reducing a magnitude of the frame with an indicated error by six decibels for a light mute and eighteen decibels for a heavy mute.

4. An apparatus for muting an audio signal in a digital communication system, such apparatus comprising: means for integrating an indicated error per audio information unit for a time interval; means for comparing the integrated value with a threshold; and means for applying a heavy mute to audio information units with an indicated error when the integrated value does not exceed the threshold and a light mute to audio information units with an indicated error when the integrated value exceeds the threshold.

5. The apparatus as in claim 4 wherein the means for integrating an indicated error per frame for a time interval further comprising means for incrementing a counter by a first value upon receipt of a bad frame and decrementing a counter by a second value upon receipt of a good frame.

6. The apparatus as in claim 4 wherein the means for applying a heavy and light mute further comprising means for reducing the magnitude of a the frame with an indicated error by six decibels for a light mute and eighteen decibels for a heavy mute.

7. A method of selectively attenuating bad frames within an information signal containing good frames and bad frames such method comprising the steps of:

receiving a frame containing a bad frame status indication message; integrating an incidence of bad frames over a time period; comparing the integrated value with a threshold; and, heavily attenuating bad frames when the integrated value does not exceed the threshold and lightly attenuating the bad frames when the integrated value exceeds the threshold.

8. The method as in claim 7 wherein integrating an incidence of bad frames further includes the step of incrementing a counter by a first value upon receipt of a bad frame and decrementing a counter by a second value upon receipt of a good frame.

9. The method as in claim 7 wherein the step of heavily and lightly attenuating, further includes reducing the magnitude of a numerical value of the frame with an indicated error by six decibels for a light mute and eighteen decibels for a heavy mute.

10. An apparatus for selectively attenuating bad frames within an information signal containing good frames and bad frames such apparatus comprising: means for receiving a frame containing a bad frame status indication message; means for integrating an incidence of bad frames over a time period; means for comparing the integrated value with a threshold; and, means for heavily attenuating a bad frame when the integrated value does not exceed the threshold and lightly attenuating the bad frame when the integrated value exceeds the threshold.

11. The apparatus as in claim 10 wherein the means for integrating an incidence of bad frames further comprises means for incrementing a counter by a first value upon receipt of a bad frame and decrementing a counter by a second value upon receipt of a good frame.

12. The apparatus as in claim 10 wherein the means for heavily and lightly attenuating further comprises means for reducing the magnitude of a numerical value of the frame with an indicated error by six decibels for a light mute and eighteen decibels for a heavy mute.

13. In a digital radio frequency receiver, a method of attenuating erroneous frames within an information signal containing good and erroneous frames, such method including the steps of: receiving a frame containing voice data and a status information, indicating an erroneous frame; integrating the incidence of erroneous frames, producing an integrated value; comparing the integrated value with a threshold; and heavily attenuating erroneous frames when the integrated value does not exceed the threshold and lightly attenuating erroneous frames when the integrated value exceeds the threshold.

14. The method as in claim 13 wherein the step of heavily and lightly attenuating, further includes reducing the magnitude of a numerical value of the frame with an indicated error by six decibels for a light mute and eighteen decibels for a heavy mute.

15. The method as in claim 13 wherein the step of integrating the incidence of erroneous frames further includes calculating the integrated value using a leaky integrator.

16. The method as in claim 15 further including the step of incrementing the integrated value by a first value upon receipt of an erroneous frame and decrementing the integrated value by a second value upon receipt of a good frame.

17. In a digital radio frequency receiver, an apparatus for attenuating erroneous frames within an information signal containing good and erroneous frames, such apparatus comprising: means for receiving a frame containing voice data and a status information, indicating an erroneous frame; integrating the incidence of erroneous frames, means for producing an integrated value; means for comparing the integrated value with a threshold; and means for heavily attenuating erroneous frames when the integrated value does not exceed the threshold and lightly attenuating erroneous frames when the integrated value exceeds the threshold.

18. The apparatus as in claim 17 wherein the means for heavily and lightly attenuating, further comprises means for reducing the magnitude of a numerical value of the frame with an indicated error by six decibels for a light mute and eighteen decibels for a heavy mute.

19. The apparatus as in claim 17 wherein the means for integrating the incidence of erroneous frames further comprises means for calculating the integrated value using a leaky integrator.

20. The apparatus as in claim 19 further comprising means for incrementing the integrated value by a first value upon receipt of an erroneous frame and decrementing the integrated value by a second value upon receipt of a good frame.

* * * * *